(12) United States Patent
Hirase et al.

(10) Patent No.: US 10,333,103 B2
(45) Date of Patent: Jun. 25, 2019

(54) ELECTROLUMINESCENT DEVICE AND METHOD FOR PRODUCING SAME

(71) Applicant: Sharp Kabushiki Kaisha, Sakai, Osaka (JP)

(72) Inventors: Takeshi Hirase, Sakai (JP); Tetsuya Okamoto, Sakai (JP); Tohru Senoo, Sakai (JP); Tohru Sonoda, Sakai (JP); Daichi Nishikawa, Sakai (JP); Seiji Fujiwara, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 3 days.

(21) Appl. No.: 15/526,171

(22) PCT Filed: Nov. 4, 2015

(86) PCT No.: PCT/JP2015/081022
§ 371 (c)(1),
(2) Date: May 11, 2017

(87) PCT Pub. No.: WO2016/076171
PCT Pub. Date: May 19, 2016

(65) Prior Publication Data
US 2017/0352835 A1 Dec. 7, 2017

(30) Foreign Application Priority Data

Nov. 12, 2014 (JP) ................................. 2014-230082

(51) Int. Cl.
*H01L 51/52* (2006.01)
*H01L 51/00* (2006.01)
(Continued)

(52) U.S. Cl.
CPC ...... *H01L 51/5253* (2013.01); *H01L 27/3244* (2013.01); *H01L 51/0097* (2013.01);
(Continued)

(58) Field of Classification Search
CPC ................................................. H01L 51/5253
See application file for complete search history.

(56) References Cited

U.S. PATENT DOCUMENTS

| 8,022,437 B2 * | 9/2011 | Koyama | ............. H01L 51/5253 257/100 |
| 2008/0063949 A1 * | 3/2008 | Inoue | .................. H01L 27/3246 430/5 |

(Continued)

FOREIGN PATENT DOCUMENTS

| JP | 2005100815 A | 4/2005 |
| JP | 2011198675 A | 10/2011 |

(Continued)

*Primary Examiner* — Mounir S Amer
(74) *Attorney, Agent, or Firm* — ScienBiziP, P.C.

(57) ABSTRACT

In an organic EL display device that includes a TFT substrate (substrate) and an organic EL element (electroluminescent element) provided on the TFT substrate, a sealing film is provided that seals the organic EL element.

The sealing film includes one or more layers of inorganic film. The thickness of a peripheral portion of at least one layer of inorganic film among the one or more layers of inorganic film is made thick.

Further, a liquid repellent layer is provided covering the sealing film.

7 Claims, 12 Drawing Sheets

(51) Int. Cl.
*H01L 27/32* (2006.01)
*H01L 51/56* (2006.01)

(52) U.S. Cl.
CPC ...... *H01L 51/56* (2013.01); *H01L 2251/5338* (2013.01); *H01L 2251/558* (2013.01)

(56) References Cited

U.S. PATENT DOCUMENTS

| | | |
|---|---|---|
| 2011/0234477 A1 | 9/2011 | Sano et al. |
| 2012/0012149 A1 | 1/2012 | Kim et al. |
| 2013/0161184 A1 | 6/2013 | Hong et al. |
| 2013/0229107 A1 | 9/2013 | Park |
| 2014/0131671 A1* | 5/2014 | Lee .................... H01L 51/0003 257/40 |
| 2016/0017170 A1* | 1/2016 | Lee ...................... C08F 230/02 257/40 |
| 2016/0028041 A1* | 1/2016 | Naganawa ............ H01L 51/448 257/40 |
| 2016/0380226 A1* | 12/2016 | Hayashi ................ H01L 51/50 257/40 |

FOREIGN PATENT DOCUMENTS

| | | |
|---|---|---|
| JP | 2012023023 A | 2/2012 |
| JP | WO 2013125352 A1 * | 8/2013 |
| JP | 2013182886 A | 9/2013 |
| JP | 2013540890 A | 11/2013 |

\* cited by examiner

ELECTROLUMINESCENT DEVICE AND METHOD FOR PRODUCING SAME

TECHNICAL FIELD

The present disclosure relates to an electroluminescent device having an electroluminescent (EL) element and to a method for producing the electroluminescent device.

BACKGROUND ART

In recent years, flat panel displays have been utilized in various products and fields, and there are demands for flat panel displays having even larger sizes, even higher picture quality, and even lower power consumption.

In view of such circumstances, organic electroluminescent (referred to as EL below) display devices provided with organic EL elements utilizing the electroluminescence of organic materials are attracting a high degree of attention as flat panel displays, due to their excellent qualities, such as low voltage driving, high responsiveness, and self-luminosity, while being in a completely solid state.

For example, in an active-matrix organic EL display device, a thin film organic EL element is provided on a substrate, on which a thin film transistor (TFT) is provided. In the organic EL element, organic EL layers including a light emitting layer are layered between a pair of electrodes. One of the pair of electrodes is connected to the TFT. Then, image display is performed by applying a voltage between the pair of electrodes and causing the light emitting layer to emit light.

Further, in this kind of conventional organic EL display device described above, in order to prevent deterioration of the organic EL element caused by moisture or oxygen, a sealing film is known to be provided for the organic EL element.

In addition, in this kind of conventional organic EL display device described above, as disclosed in PTL 1 (see below), for example, it is proposed to provide, on the organic EL element, a sealing film in which an organic film and an inorganic film are alternately layered. Then, in this conventional organic EL display device, it is said that deterioration of the organic EL element caused by moisture or oxygen can be inhibited by the sealing film.

CITATION LIST

Patent Literature

PTL 1: Japanese Unexamined Patent Application Publication No. 2013-182886A

SUMMARY

Technical Problem

However, in the conventional organic EL display device described above, it is not always possible to prevent the permeation of moisture into the organic EL element (electroluminescent element). Thus, in this conventional organic EL display device, a problem occurs in which the deterioration of the organic EL element caused by moisture permeation cannot be prevented, and reliability declines.

More specifically, in the conventional organic EL display device described above, when an organic film is formed on the organic EL element, moisture is sometimes included in the organic film, and this moisture reaches the organic EL element, thus resulting in deterioration of the organic EL element. On the other hand, when an inorganic film is formed on the organic EL element, defects such as pin holes or cracks occur in this inorganic film, interfacial peeling occurs due to film stress, and moisture permeates through the inorganic film, thus resulting in the deterioration of the organic EL element.

In light of the foregoing, it is an object of the present disclosure to provide an electroluminescent device offering excellent reliability that can improve barrier properties for an electroluminescent element and can significantly suppress the occurrence of deterioration in the electroluminescent element caused by moisture, and a production method for the electroluminescent device.

Solution to Problem

To achieve the above object, an electroluminescent device according to an aspect of the present invention includes a substrate, an electroluminescent element provided on the substrate, and a sealing film configured to seal the electroluminescent element.

The sealing film includes one or more layers of inorganic film, and, a peripheral portion of at least one layer of inorganic film, of the one or more layers of inorganic film, is thick.

A liquid repellent layer is provided covering the sealing film.

In the electroluminescent device configured as described above, the at least one layer of inorganic film is included in the sealing film. Further, of the one or more layers of inorganic film, the thickness of the peripheral portion of the at least one layer of inorganic film is made thick. In addition, the liquid repellent layer is provided covering the sealing film. In this way, in contrast to the conventional example described above, the electroluminescent device offering excellent reliability can be configured that can improve the barrier properties for the electroluminescent element and can significantly suppress the occurrence of deterioration in the electroluminescent element caused by moisture.

Further, in the electroluminescent device described above, an inorganic film provided in a position closest to the electroluminescent element may be used as the at least one layer of inorganic film.

In this case, the permeation of moisture into the electroluminescent element can be even more reliably inhibited, and the occurrence of deterioration in the electroluminescent element caused by moisture can be significantly suppressed.

Further, in the electroluminescent device described above, an inorganic film provided in a position furthest from the electroluminescent element and configured in a frame shape may be used as the at least one layer of inorganic film.

In this case, the at least one layer of inorganic film described above can be easily formed, and the electroluminescent device offering excellent reliability can be easily configured.

Further, in the electroluminescent device described above, a leveled film may be provided on the at least one layer of inorganic film.

In this case, the liquid repellent layer or the like formed on the leveled film can be easily formed.

Further, in the electroluminescent device described above, a thickness of a peripheral portion of the at least one layer of inorganic film is preferably not less than 50 nm.

In this case, irrespective of a film composition of the sealing film and of a material of the inorganic film, the barrier properties for the electroluminescent element can be improved and the occurrence of deterioration in the electroluminescent element caused by moisture can be more reliably and significantly suppressed.

Further, in the electroluminescent device described above, fluorine may be used in the liquid repellent layer.

In this case, the liquid repellent layer capable of reliably suppressing the permeation of moisture can be easily formed.

A method for producing an electroluminescent device according to an aspect of the present invention is a method for producing an electroluminescent device including a substrate and an electroluminescent element provided on the substrate. The method includes: forming a sealing film that seals the electroluminescent element, the sealing film including one or more layers of inorganic film, and the forming a sealing film including making thick a peripheral portion of at least one layer of inorganic film of the one or more layers of inorganic film, and forming a liquid repellent layer covering the sealing film.

In the method for producing the electroluminescent device configured as described above, by the forming a sealing film, the sealing film can be formed that includes one or more layers of the inorganic film, and, of the one or more layers of inorganic film, a peripheral portion of at least one layer of inorganic film is made thick. Further, by the forming a liquid repellent layer, the liquid repellent layer can be formed covering the sealing film. In this way, in contrast to the conventional example described above, the electroluminescent device offering excellent reliability can be configured that can improve the barrier properties for the electroluminescent element and can significantly suppress the occurrence of deterioration in the electroluminescent element caused by moisture.

Further, in the method for producing the electroluminescent device, the forming a sealing layer may include forming the at least one layer of inorganic film by one of CVD and sputtering, and the forming the at least one layer of inorganic film includes making thick the peripheral portion of the at least one layer of inorganic film by causing the substrate to tilt with respect to a material generating source of the at least one layer of inorganic film.

In this case, the thickness of the peripheral portion of the at least one layer of inorganic film can be reliably made thick, and the electroluminescent device offering excellent reliability can be easily configured.

Further, in the method described above for producing the electroluminescent device, the forming a liquid repellent layer preferably includes forming a liquid repellent layer using fluorine by using one of microwaves and plasma waves.

In this case, the liquid repellent layer capable of reliably suppressing the permeation of moisture can be easily formed.

Advantageous Effects of Invention

According to an aspect of the present disclosure, an electroluminescent device offering excellent reliability and a method for producing the electroluminescent device can be provided. As a result, the electroluminescent device can improve barrier properties for an electroluminescent element and can significantly suppress the occurrence of deterioration in the electroluminescent element caused by moisture.

DESCRIPTION OF EMBODIMENTS

Below, preferred embodiments of an electroluminescent device and a method for producing the electroluminescent device according to an aspect of the present invention will be described with reference to the drawings. Note that, in the following description, examples will be described when the aspect of the present invention is applied to an organic EL display device. Further, dimensions in each of the drawings of constituent members do not accurately represent dimensions of actual constituent members, nor dimensional ratios and the like of each of constituent members.

First Embodiment

Figure 1:
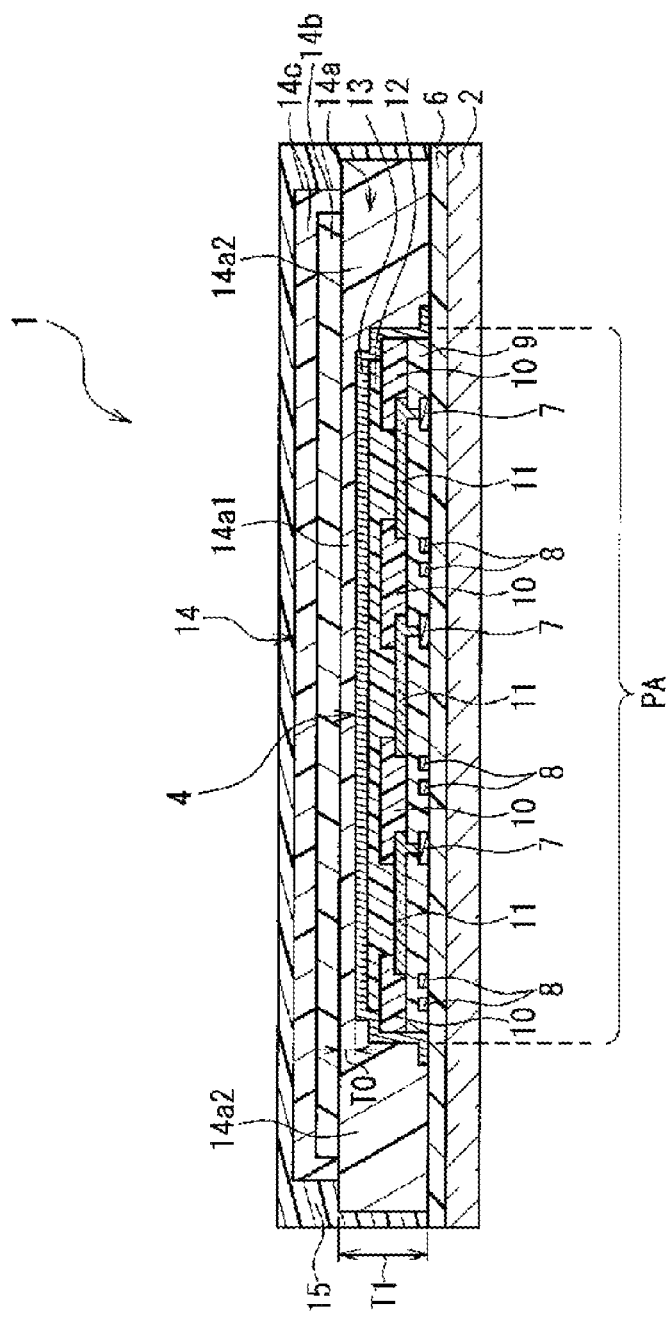
FIG. 1 is a cross-sectional view illustrating a cross section of an organic EL display device according to a first embodiment of the present invention.

FIG. 1 is a cross-sectional view illustrating a cross section of an organic EL display device according to a first embodiment of the present invention. In FIG. 1, an organic EL display device 1 of the present embodiment is provided with a TFT substrate 2 as a substrate, and an organic EL element 4 as an electroluminescent element provided on the TFT substrate 2.

Further, in the organic EL display device 1 of the present embodiment, the organic EL element 4 configures a rectangular pixel area PA that has a plurality of pixels (including a plurality of sub pixels), and the organic EL element 4 is sealed by a sealing film 14. In addition, the pixel area PA described above configures a display portion of the organic EL display device 1, and displays information. Specifically, in the pixel area PA, as will be described in more detail later, a plurality of pixels (a plurality of sub pixels) are arranged in a matrix shape, and the organic EL element 4 has a configuration in which each of the sub pixels emits light, as a result, the organic EL element 4 displays information.

Further, in FIG. 1, the TFT substrate 2 is configured by, for example, a glass material, or a flexible (bendable) film or the like. Further, a foundation film (an insulating film) 6 is provided on the TFT substrate 2 covering a whole surface thereof. In addition, as illustrated in FIG. 1, in the organic EL display device 1, a thin film transistor (TFT) 7 is provided on the foundation film 6 for each of the sub pixels of the pixel area PA. Further, wires 8, which include a plurality of source lines (signal wires) and a plurality of gate lines provided in a matrix shape, are formed on the foundation film 6. A source driver and a gate driver (not illustrated) are connected to each of the source lines and the gate lines, and drive the TFT 7 of each of the sub pixels in response to image signals input from an external source. Further, the TFT 7 functions as a switching element that controls the light emission of the corresponding sub pixel, and is configured to control the light emission in the sub pixel of each of the colors of red (R), green (G), and blue (B) configured by the organic EL element 4.

Note that the foundation film 6 is designed to inhibit a deterioration in performance of the TFT 7 resulting from impurity diffusion from the TFT substrate 2 to the TFT 7, and if this type of deterioration is not a matter for concern, installation of the foundation film 6 may be omitted.

In addition, when the TFT substrate 2 is a flexible film, to inhibit deterioration of the TFTs 7 or the organic EL element 4 due to penetration (permeation) of moisture or oxygen from the outside, a moisture-proof layer configured by an inorganic film, such as silicon nitride or silicon oxinitride, may be formed in advance on the TFT substrate 2.

As illustrated in FIG. 1, an interlayer insulating film 9, edge covers 10, and first electrodes 11 of the organic EL element 4 are formed on the TFT substrate 2. The interlayer insulating film 9 also functions as a leveled film, and is provided on the foundation film 6 while covering the TFTs 7 and the wires 8. The edge cover 10 is formed on the interlayer insulating film 9 while covering a pattern end portion of the first electrode 11. Further, the edge cover 10 is also configured to function as an insulating layer to inhibit a short circuit between the first electrode 11 and a second electrode 13 to be described later. In addition, the first electrode 11 is connected to the TFT 7 via a contact hole formed in the interlayer insulating film 9.

Further, an opening of the edge cover 10, namely, a portion at which the electrode 11 is exposed, substantially configures a light-emitting region of the organic EL element 4, and, as described above, the organic EL display device 1 of the present embodiment is configured to be able to perform full color display by the light emission of any one of the RGB colored lights. In addition, the organic EL display device 1 of the present embodiment configures an active-matrix display device that has the thin film transistors (TFTs) 7.

Further, as illustrated in FIG. 1, an organic EL layer 12 and the second electrode 13 are formed on the first electrodes 11, and the organic EL element 4 is configured by the first electrodes 11, the organic EL layer 12, and the second electrode 13. Specifically, the organic EL element 4 is, for example, a light-emitting element capable of emitting light at high luminance as a result of low-voltage DC power driving, and is provided with the first electrodes 11, the organic EL layer 12, and the second electrode 13.

More specifically, when the first electrodes 11 are positive electrodes, from the first electrode 11 side, a hole injecting layer, a hole transport layer, a light-emitting layer, an electron transport layer, an electron injecting layer and the like are layered (not illustrated) as the organic EL layer 12, and the second electrode 13 is further formed as a negative electrode. Further, in addition to the following description, a configuration may be adopted in which a single layer may have two or more functions, such as the hole injecting layer that also functions as the hole transport layer. In addition, in the organic EL layer 12, a carrier blocking layer or the like can be inserted as necessary.

Meanwhile, when the second electrode 13 is the positive electrode, the order of layers in the organic EL layer 12 is the reverse to the order described above.

Further, when each of the first electrodes 11 is configured by a transparent electrode or a translucent electrode, and the second electrode 13 is configured by a reflective electrode, the organic EL display device 1 is a bottom-emitting type that emits light from the TFT substrate 2 side. Specifically, in this bottom-emitting organic EL display device 1, the surface of each of the first electrodes 11 on the TFT substrate 2 side configures a substantial light emitting surface of the organic EL element 4, and is configured to emit light to the outside.

In contrast, when each of the first electrodes 11 is configured by a reflective electrode, and the second electrode 13 is configured by a transparent electrode or a translucent electrode, the organic EL display device 1 is a top-emitting type that emits light from the sealing film 14. Specifically, in this top-emitting organic EL display device 1, the surface of each of the first electrodes 11 on the sealing film 14 side configures the substantial light emitting surface of the organic EL element 4, and is configured to emit light to the outside.

Further, as described above, in the organic EL display device 1 of the present embodiment, the organic EL element 4 is sealed by the sealing film 14. In addition, in the organic EL display device 1 of the present embodiment, a liquid repellent layer 15 is provided covering the sealing film 14. Then, the organic EL display device 1 of the present embodiment has a configuration in which the sealing film 14 and the liquid repellent layer 15 inhibit moisture, oxygen or the like from penetrating (permeating) from the outside, and thus inhibit the deterioration of the organic EL element 4.

Further, the sealing film 14 is configured by a plurality of, for example three, sealing films. Specifically, as illustrated in FIG. 1, the sealing film 14 is configured by a layered structure in which an inorganic film 14a is provided on the organic EL element 4 side, an organic film 14b is provided on the inorganic film 14a, and an inorganic film 14c is provided on the organic film 14b.

Silicon nitride, silicon oxide, silicon oxinitride, aluminum oxide, or the like is used in the inorganic films 14a and 14c, for example. Further, an organic silicon (organosilicon) such as polysiloxane, or silicon oxycarbide, acrylate, polyurea, Parylene, a polyimide, a polyamide, or the like is used in the organic film 14b, for example.

Further, in the organic EL display device 1 of the present embodiment, the inorganic film 14a is provided on the organic EL element 4 side, and thus, an adverse influence of moisture on the organic EL element 4 is more reliably inhibited by the inorganic film 14a. Further, the organic film 14b is provided on the inorganic film 14a, and as a result, stress on the inorganic film 14a can be released. Even if defects such as pin holes, cracks, or damage caused by foreign material occurs in the inorganic film 14a, these can be covered by the organic film 14b, and a deterioration in the sealing performance of the sealing film 14 can be even more reliably inhibited.

Additionally, in the organic EL display device 1 of the present embodiment, the inorganic film 14a configures at least one of the inorganic film layers, and, in the inorganic film 14a, a thickness of a peripheral portion (at least a portion on the outer side of the pixel area PA) 14a2 is set to be a greater value (a thicker value) than a thickness of a central portion (at least a portion that is the pixel area PA) 14a1. As a result, the permeation of moisture from the outside of the sealing film 14 can be significantly suppressed (this will be described in more detail later).

Figure 2:
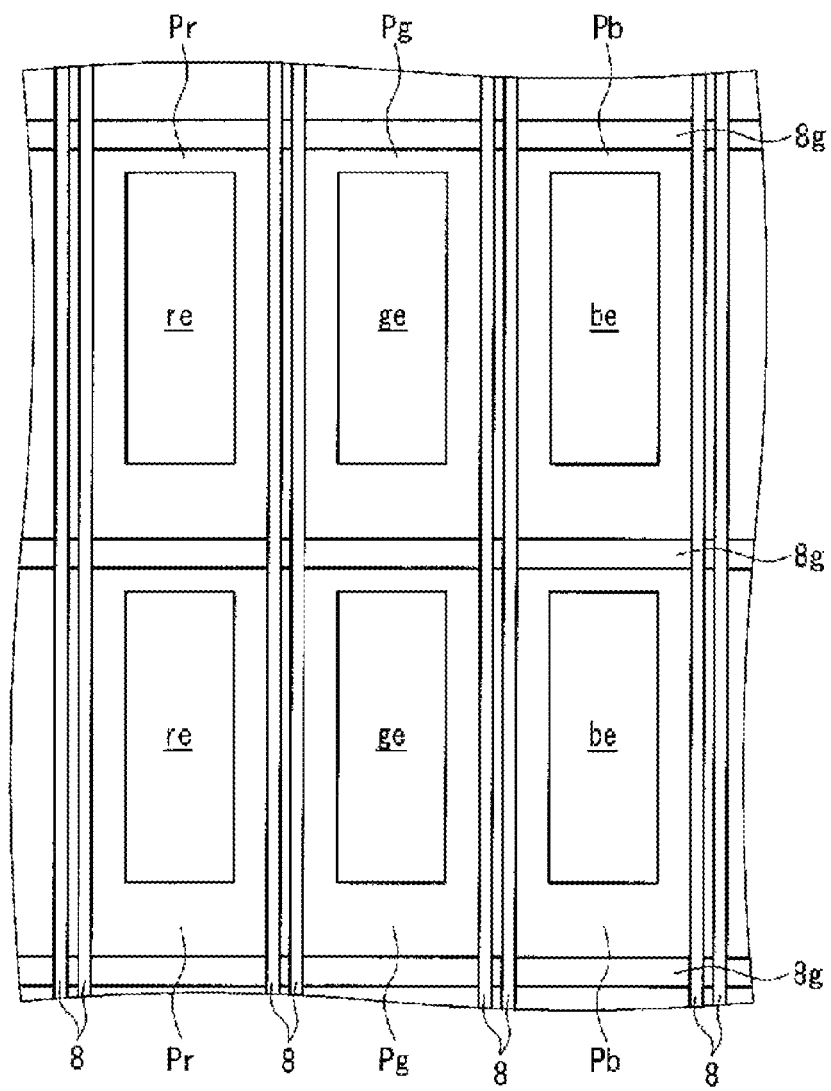
FIG. 2 is an enlarged plan view illustrating a pixel configuration of the organic EL display device described above.

Next, with reference to FIG. 2, the pixel area PA of the organic EL display device 1 of the present embodiment will be specifically described.

FIG. 2 is an enlarged plan view illustrating a pixel configuration of the organic EL display device described above.

Figure 3:
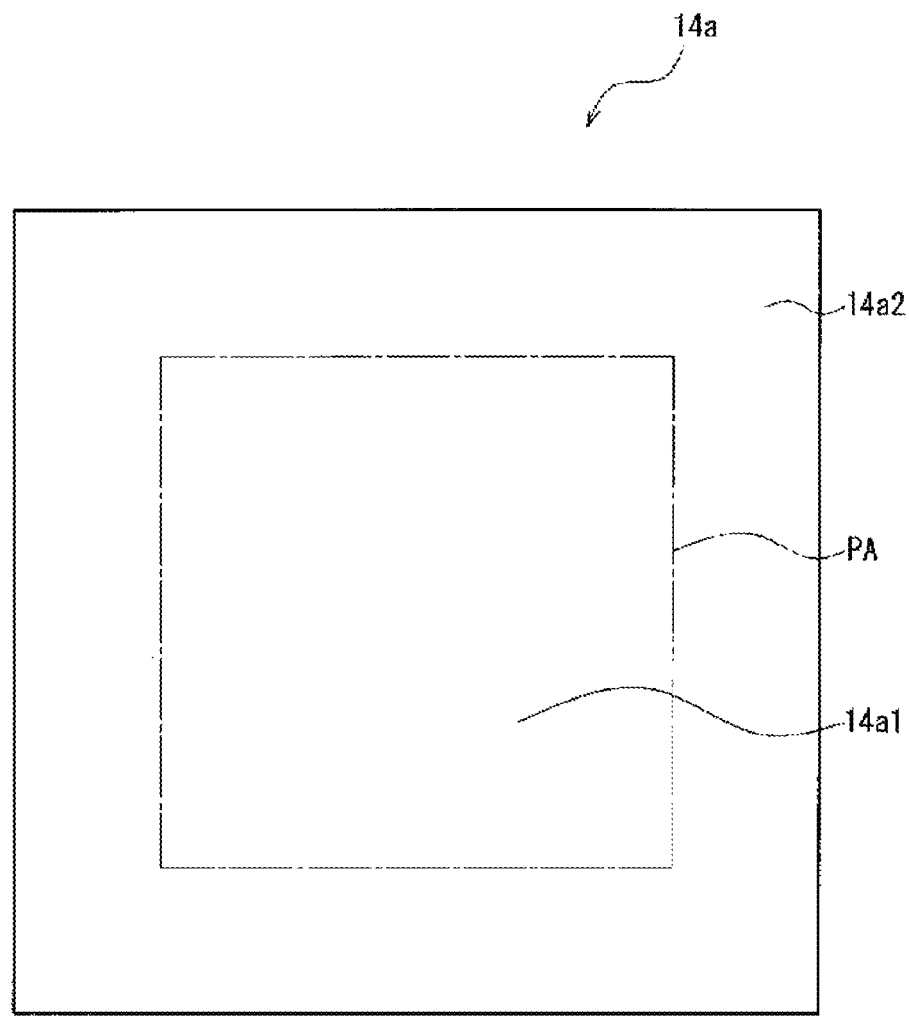
FIG. 3 is a diagram illustrating a configuration of main components of an inorganic film included in a sealing film illustrated in FIG. 1.

As illustrated in FIG. 2, in the organic EL display device 1 of the present embodiment, in the pixel area PA (FIG. 1), red, green, and blue sub pixels Pr, Pg, and Pb (hereinafter referred to collectively as sub pixels P) that respectively emit red (R) light, green (G) light, and blue (B) light are provided in a matrix shape. Specifically, the plurality of sub pixels P are each partitioned by two of the wires 8 and a gate line 8g connected to a gate of the TFT 7. More specifically, with respect to a pixel area of each of the sub pixels P, a dimension in the left-right direction in FIG. 3 is a dimension between a center line of the two wires 8 disposed close to each other and a center line of the two wires 8 that are adjacent, in the left-right direction in FIG. 2, to the two wires 8 disposed close to each other. Further, a dimension in the up-down direction in FIG. 2 is a dimension between centers of the two gate lines 8g that are adjacent to each other. Further, a surface area of the pixel area of each of the sub pixels P is defined by the left-right dimension and the up-down dimension in the above-described FIG. 2.

Further, in the pixel area PA, a single pixel is configured by a set of the red, green, and blue sub pixels Pr, Pg, and Pb.

Further, in the red sub pixel Pr, a portion exposed from an opening re of the edge cover 10 configures an actual light-emitting region of the red sub pixel Pr. Similarly, in the green sub pixel Pg, a portion exposed from an opening ge of the edge cover 10 configures an actual light-emitting region of the green sub pixel Pg, and in the blue sub pixel Pb, a portion exposed from an opening be of the edge cover 10 configures an actual light-emitting region of the blue sub pixel Pb.

Next, with reference to FIG. 1 and FIG. 3, the inorganic film 14a and the liquid repellent layer 15 of the present embodiment will be described in detail.

FIG. 3 is a diagram illustrating a configuration of main components of an inorganic film included in a sealing film illustrated in FIG. 1.

In FIG. 1, of the sealing film 14, the inorganic film 14a is provided in the position closest to the organic EL element 4, and, as described above, the inorganic film 14a configures at least one layer of the inorganic film. Specifically, as illustrated in FIG. 3, the inorganic film 14a is provided with the central portion 14a1, and the peripheral portion 14a2 that is formed in a frame shape at edge portions of the inorganic film 14a and encompasses the central portion 14a1. Then, as illustrated in FIG. 1, in the inorganic film 14a, the thickness of the peripheral portion 14a2 is thicker than the thickness of the central portion 14a1.

Specifically, in the inorganic film 14a, the thickness (indicated by "T0" in FIG. 1) of the central portion 14a1 is set as 10 nm, for example. Meanwhile, the thickness (indicated by "T1" in FIG. 1) of the peripheral portion 14a2 is set to 50 nm or greater, for example.

In addition, the inorganic film 14a is, for example, formed using CVD or sputtering, and in the present embodiment, the thickness of the peripheral portion 14a2 is made thicker by causing the TFT substrate 2 to tilt at the time of formation (film formation) of the inorganic film 14a (this will be described in detail later).

Further, fluorine is used in the liquid repellent layer 15, for example, and the liquid repellent layer 15 exhibits water-repelling properties against moisture from the outside of the organic EL display device 1, thus inhibiting the permeation of moisture to the utmost extent.

Next, with reference to FIG. 4 to FIG. 9, the method for producing the organic EL display device 1 of the present embodiment will be specifically described.

Figure 4:
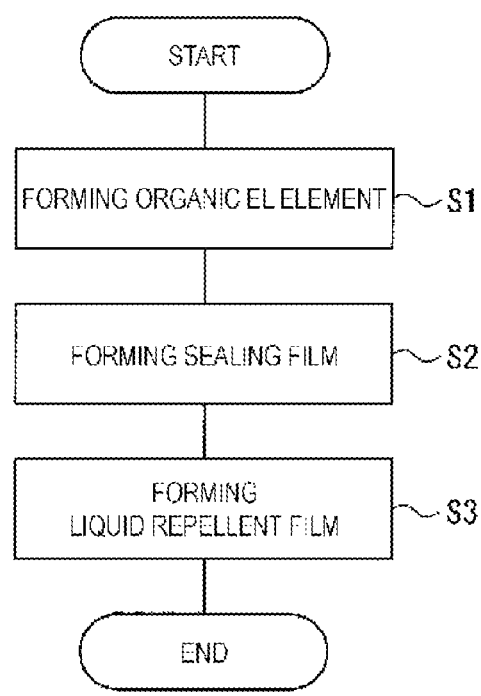
FIG. 4 is a flowchart illustrating a production process of the organic EL display device described above.
Figure 5:
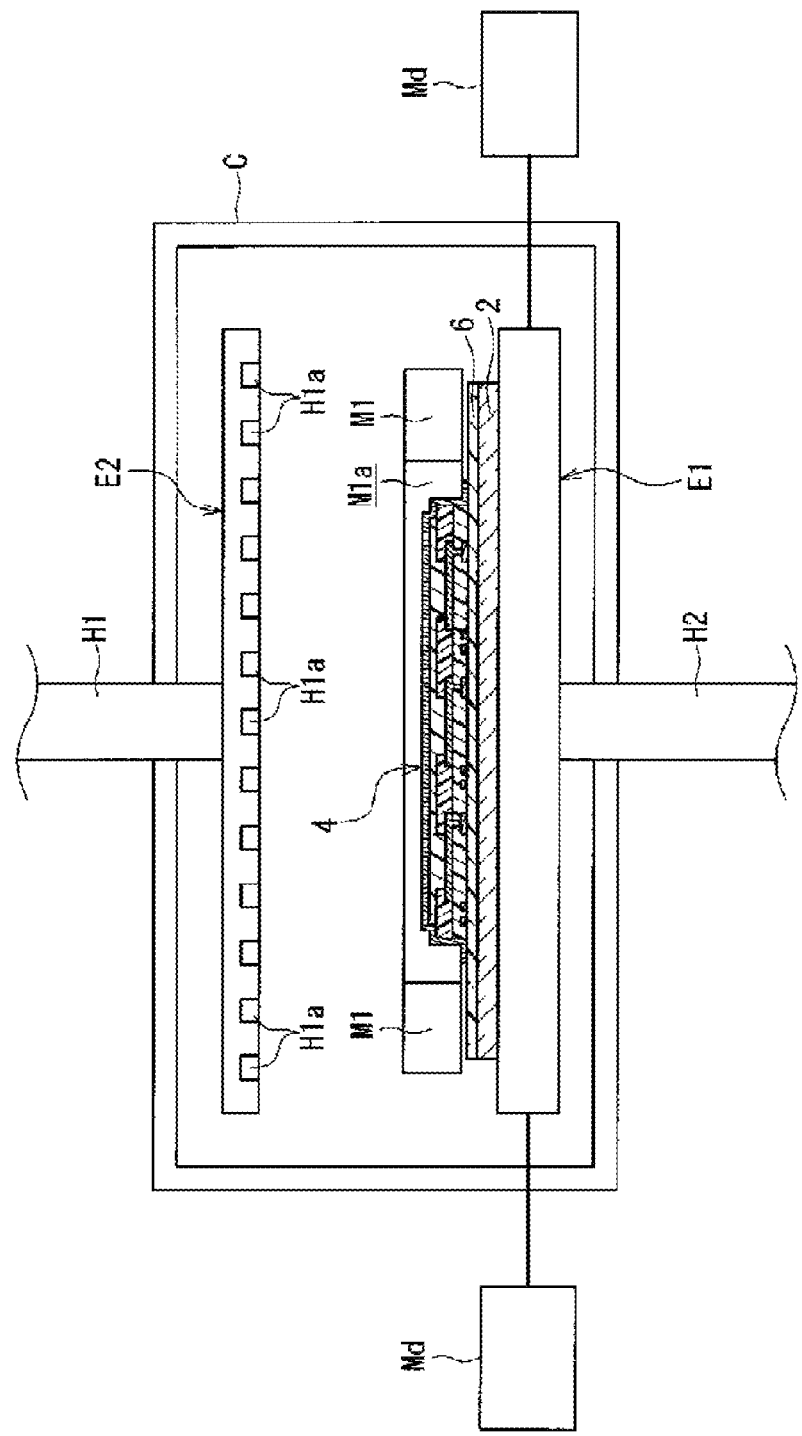
FIG. 5 is a diagram illustrating a configuration of main components of a production device of the organic EL display device described above.
Figure 6:
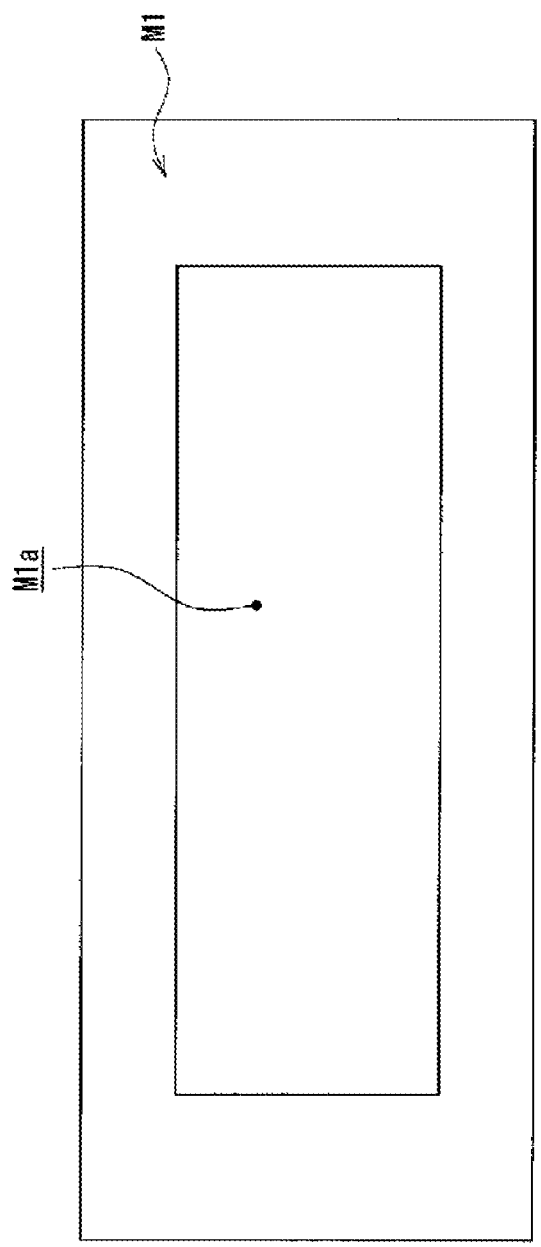
FIG. 6 is a plan view illustrating a mask used in a process for forming a sealing film illustrated in FIG. 4.
Figure 7:
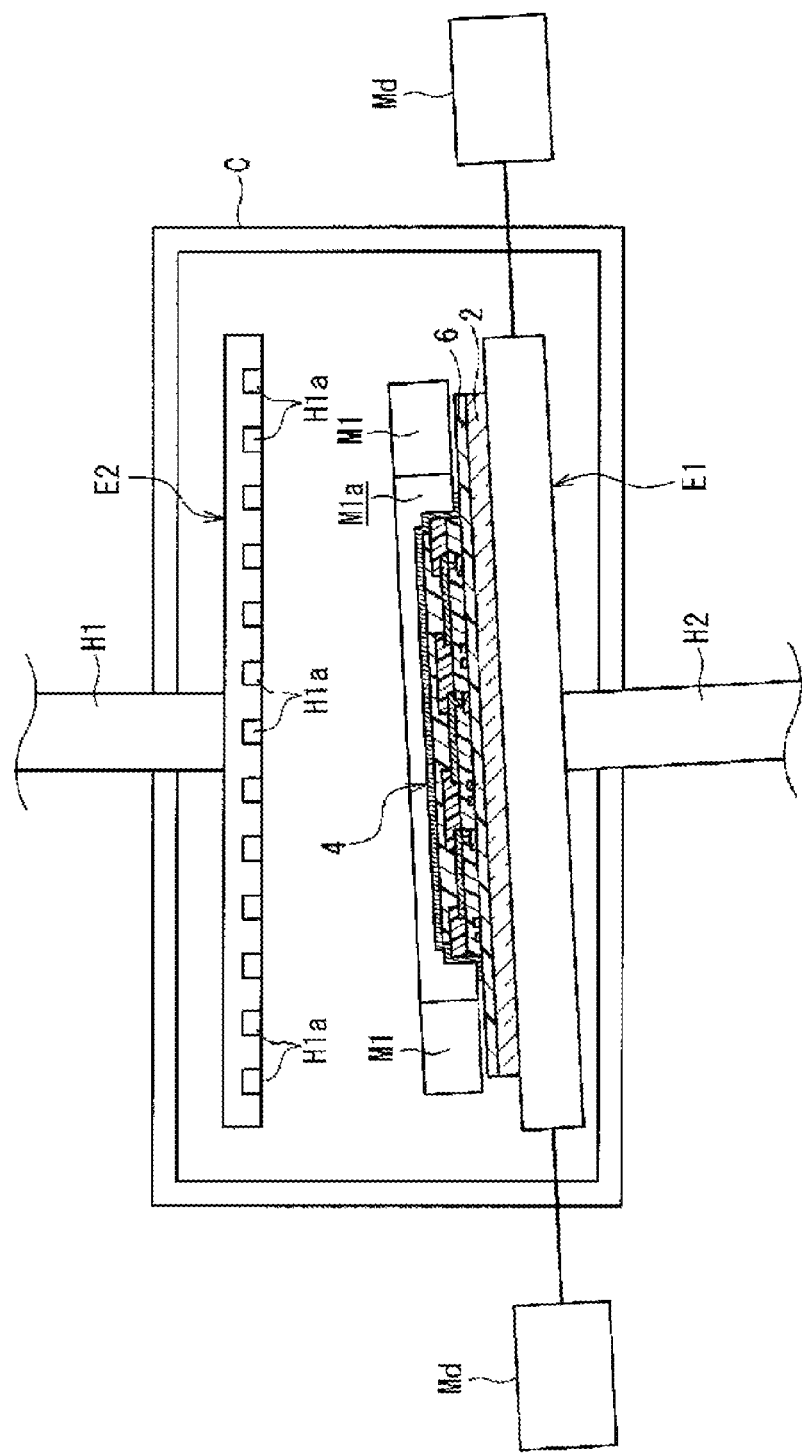
FIG. 7 is a diagram illustrating a process, in the process for forming the sealing film described above, to thicken a peripheral portion of the inorganic film included in the sealing film.
Figure 8:
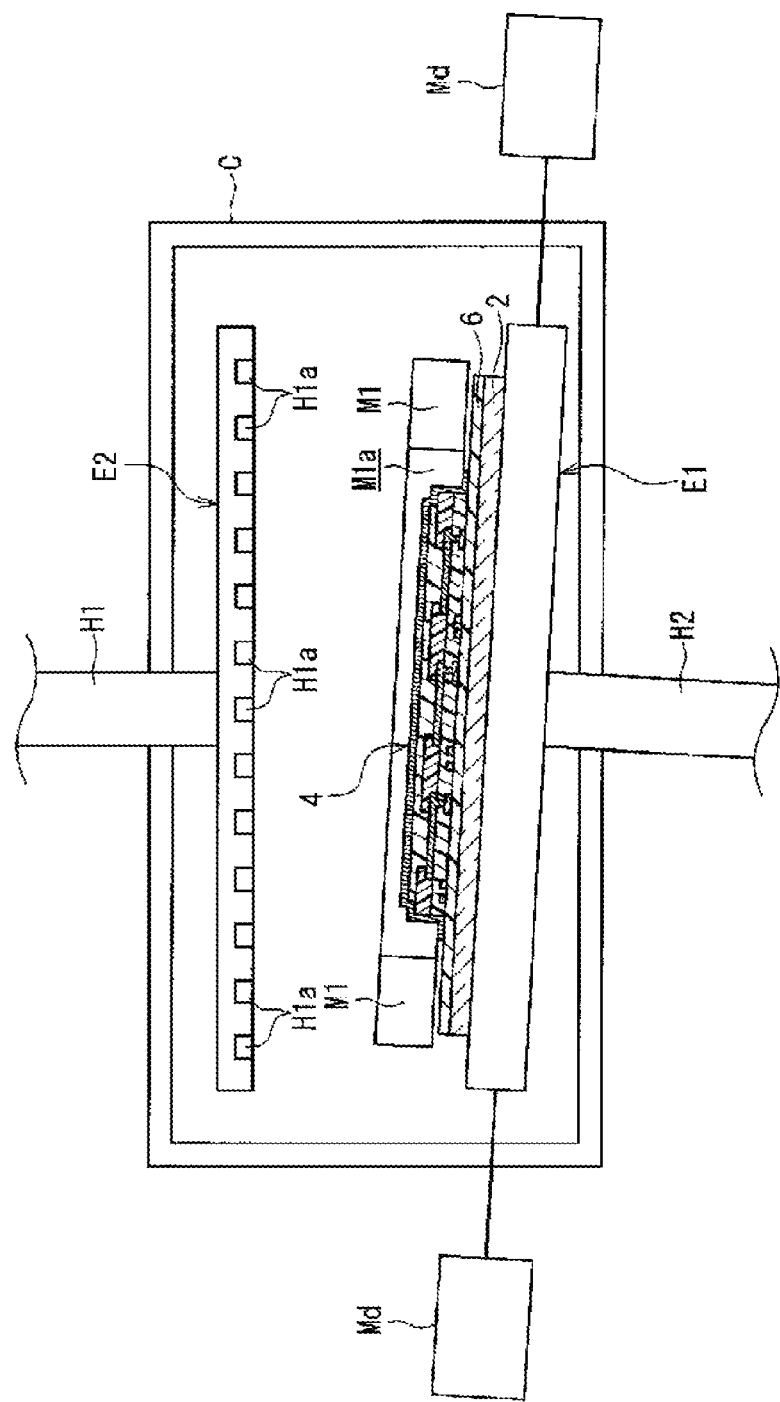
FIG. 8 is a diagram illustrating the process, in the process for forming the sealing film, to thicken the peripheral portion of the inorganic film included in the sealing film.
Figure 9:
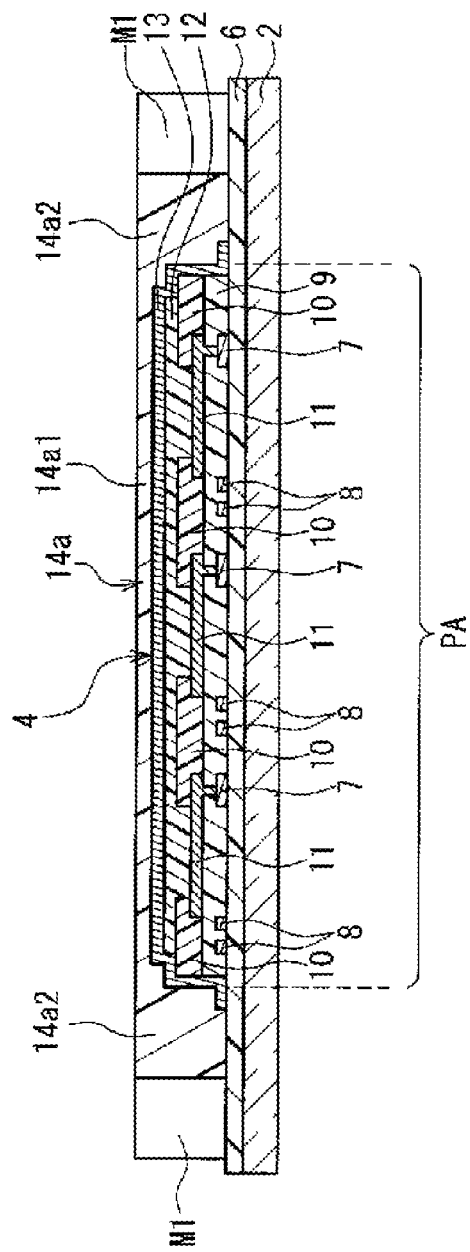
FIG. 9 is a diagram illustrating the above inorganic film after the processes illustrated in FIG. 7 and FIG. 8 have been performed.

FIG. 4 is a flowchart illustrating a production process of the organic EL display device described above. FIG. 5 is a diagram illustrating a configuration of main components of a production device of the organic EL display device described above. FIG. 6 is a plan view illustrating a mask used in a process for forming a sealing film illustrated in FIG. 4. FIG. 7 is a diagram illustrating a process, in the process for forming the sealing film forming process, to make thicker the peripheral portion of the inorganic film included in the sealing film. FIG. 8 is a diagram illustrating a process, in the process for forming the sealing film, to make thicker the peripheral portion of the inorganic film included in the sealing film. FIG. 9 is a diagram illustrating the inorganic film described above after the processes illustrated in FIG. 7 and FIG. 8 have been performed.

As illustrated in step S1 in FIG. 4, in the organic EL display device 1 of the present embodiment, first, a process for forming an organic EL element is performed to form the organic EL element 4 on the TFT substrate 2. In the process for forming the organic EL element, the structural elements of the organic EL element 4, such as the TFTs 7 and the wires 8, are sequentially formed on the foundation film 6 of the TFT substrate 2.

Next, as illustrated in step S2 in FIG. 4, a process for forming a sealing film is performed to form, on the organic EL element 4, the sealing film 14 that seals the organic EL element 4. In the process for forming the sealing film, the inorganic film 14a and the inorganic film 14c that are included in the sealing film 14 are formed using CVD, sputtering, or the like. In particular, when CVD is used, because a capability to cover level differences is high, the CVD is favorable in that each of the inorganic film 14a and the inorganic film 14c can be more appropriately formed.

Further, the organic film 14b is formed using CVD, sputtering, vapor deposition, or vapor deposition polymerization, for example. In particular, when CVD or sputtering is used, the organic film 14b can be formed in the same chamber as the inorganic film 14a and the inorganic film 14c, and thus, the inorganic film 14a, the organic film 14b, and the inorganic film 14c can be continuously formed while each of appropriate masks is made to closely contact the TFT substrate 2.

Here, with reference to FIG. 5 to FIG. 9, the production process of the inorganic film 14a in the organic EL display device 1 of the present embodiment will be specifically described. Note that, in the following description, a case will be described in which the inorganic film 14a is formed using (plasma) CVD, for example.

The inorganic film 14a is formed inside a film forming chamber (chamber) C of the production device illustrated in FIG. 5. Further, in the process for forming the inorganic film 14a, a mask M1 illustrated in FIG. 6 is used. Specifically, as illustrated in FIG. 6, the mask M1 is provided with an opening M1a, and the organic EL element 4 on the TFT substrate 2 is disposed inside the opening M1a (see FIG. 5).

Further, in FIG. 5, the film forming chamber C is provided with a first electrode E1 provided on a lower side of the film forming chamber C, and a second electrode E2 provided facing the first electrode E1. The TFT substrate 2, on which the foundation film 6 and the organic EL element 4 have been formed, is placed on the first electrode E1. Further, a gas supply portion H1, which supplies gas for film formation and gas for cleaning, is provided on the second electrode E2, and a plurality of holes H1a, which are included in the gas supply portion H1 and through which the gases described above are supplied, are provided in a facing surface, of the second electrode E2, which faces the first electrode E1. In addition, a vacuum exhaust portion H2 for creating a vacuum atmosphere in the film forming chamber C is provided in the first electrode E1.

Further, the mask M1 is provided above the first electrode E1. As illustrated in FIG. 6, the mask M1 is provided with the opening M1a, and the organic EL element 4 on the TFT substrate 2 is disposed inside the opening M1a. Then, the process for forming the inorganic film 14a is performed while the mask M1 is provided.

Specifically, when the inorganic film 14a is formed of SiN, for example, as the film formation gas, SiH4 and NH3 are supplied from the gas supply holes H1a and in this state, a voltage is applied to the first and second electrodes E1 and E2.

In addition, as illustrated in FIG. 5, a substrate drive portion Md is connected to the first electrode E1, and, at the time of film formation of the inorganic film 14a, the substrate drive portion Md causes the TFT substrate 2 to tilt with respect to the gas supply holes H1a that function as a material generating source. In this way, in the present embodiment, the thickness of the peripheral portion 14a2 of the inorganic film 14a is caused to be thicker.

Specifically, for example, as illustrated in FIG. 7, the substrate drive portion Md causes the TFT substrate 2 to tilt diagonally upward to the right with respect to the gas supply holes H1a, and, when the TFT substrate 2 is tilted in this manner, the film formation gas from the gas supply holes H1a is supplied in a relatively greater amount to the opening M1a above the right end portion of the organic EL element 4 that has come closer to the gas supply holes H1a than to the central portion and the left end portion, namely, the portions other than the right end portion, of the organic EL element 4. As a result, the thickness of the inorganic film 14a on the right end portion of the organic EL element 4, specifically, the thickness of the peripheral portion 14a2 on the right side of the inorganic film 14a, is formed to be thicker than other portions thereof.

Next, as illustrated in FIG. 8, the substrate drive portion Md causes the TFT substrate 2 to tilt diagonally upward to the left with respect to the gas supply holes H1a, and, when the TFT substrate 2 is tilted in this manner, the film formation gas from the gas supply holes H1a is supplied in a relatively greater amount to the opening M1a above the left end portion of the organic EL element 4 that has come closer to the gas supply holes H1a than to the central portion and the right end portion, namely, the portions other than the left end portion, of the organic EL element 4. As a result, the thickness of the inorganic film 14a on the left end portion of the organic EL element 4, specifically, the thickness of the peripheral portion 14a2 on the left side of the inorganic film 14a, is formed to be thicker than the other portions thereof.

As described above, in the process for forming the inorganic film 14a, the TFT substrate 2 is caused to tilt with respect to the gas supply holes (the material supply source) H1a. In this way, in the present embodiment, as illustrated in FIG. 9, the thickness of the peripheral portion 14a2 of the inorganic film 14a is caused to be thicker than the thickness of the central portion 14a1 thereof.

Note that, in addition to the above description, when the inorganic film 14a is formed using sputtering, for example, with respect to the target that is the material supply source, the TFT substrate 2 provided with the mask M1 is caused to tilt in a similar manner, and thus, the thickness of the peripheral portion 14a2 of the inorganic film 14a can be made thicker.

Next, as illustrated in step S3 in FIG. 4, a process for forming a liquid repellent layer is performed that forms the liquid repellent layer 15 covering the sealing film 14. In the process for forming the liquid repellent layer, an intermediate product on which the sealing film 14 has been formed, is placed in a film formation chamber (not illustrated). Then, in a state in which a carbon tetrafluoride (CF4) gas is supplied to the interior of the film forming chamber described above, the liquid repellent layer 15 using fluorine is formed covering the sealing film 14, by performing plasma treatment using microwaves or plasma waves.

Further, if the liquid repellent layer 15 includes Al2O3, for example, the liquid repellent layer 15 is configured to have a thickness of 10 nm or greater, for example. Further, if the liquid repellent layer 15 includes a substance other than Al2O3, for example, the liquid repellent layer 15 is preferably configured to have a thickness of 100 nm or greater, for example. In addition, in the process for forming the liquid repellent layer, using microwaves is preferable to using plasma waves, from the viewpoint of being able to more efficiently form the liquid repellent film 15 having excellent barrier properties (water repelling properties, namely, liquid repelling effects).

In the organic EL display device 1 of the present embodiment configured in this way, the inorganic films 14a and 14c are included in the sealing film 14. Further, in the inorganic film (the at least one layer of inorganic film) 14a, the thickness of the peripheral portion 14a2 is made thick. In addition, the liquid repellent layer 15 is provided covering the sealing film 14. In this way, in the present embodiment, in contrast to the conventional example described above, the organic EL display device (electroluminescent device) 1 offering excellent reliability can be configured to improve the barrier properties for the organic EL element (electroluminescent element) 4, and significantly suppress the occurrence of deterioration of the organic EL element 4 caused by moisture.

Specifically, in the present embodiment, the liquid repellent layer 15 is provided covering the sealing film 14 that seals the organic EL element 4, and thus, the permeation of moisture present on the outside of the organic EL display device 1 can be inhibited to the utmost extent. Further, even if moisture permeates into the liquid repellent layer 15, because the thickness of the peripheral portion 14a2 of the inorganic film 14a is made thick, a permeation speed at which the permeated moisture reaches the organic EL element 4 can be significantly slowed. Thus, the occurrence of deterioration of the organic EL element 4 caused by moisture can be significantly suppressed.

Further, in the present embodiment, in the sealing film 14, the inorganic film 14a provided in the position closest to the organic EL element 4 is used as the at least one layer of inorganic film, and thus, the permeation of the moisture into the organic EL element 4 can be more reliably inhibited. As a result, the occurrence of deterioration of the organic EL element 4 caused by moisture can be even more significantly suppressed.

In addition, in the present embodiment, because the thickness of the peripheral portion 14a2 of the inorganic film 14a is 50 nm or greater, the barrier properties for the organic EL element 4 can be improved, regardless of a film configuration of the sealing film 14 and of a material of the inorganic film 14a. Therefore, the occurrence of deterioration of the organic EL element 4 caused by moisture can be even more reliably and significantly suppressed.

Further, in the present embodiment, fluorine is used in the liquid repellent layer 15, and thus, the liquid repellent layer 15 capable of reliably suppressing the permeation of moisture can be easily formed.

Further, in the present embodiment, in the process for forming the sealing film, CVD or sputtering is used to form the inorganic film 14a, and also, when the inorganic film 14a is formed, the TFT substrate 2 is caused to tilt with respect to the material generating source of the inorganic film 14a. As a result, the thickness of the peripheral portion 14a2 of the inorganic film 14a is made thick. In this way, the thickness of the peripheral portion 14a2 of the inorganic film 14a can be reliably made thick, and the organic EL display device 1 offering excellent reliability can be easily configured.

Further, in the present embodiment, in the process for forming the liquid repellent layer, the liquid repellent layer 15 using fluorine is formed using microwaves or plasma waves, and thus, the liquid repellent layer 15 capable of reliably suppressing the permeation of moisture can be easily formed.

Second Embodiment

Figure 10:
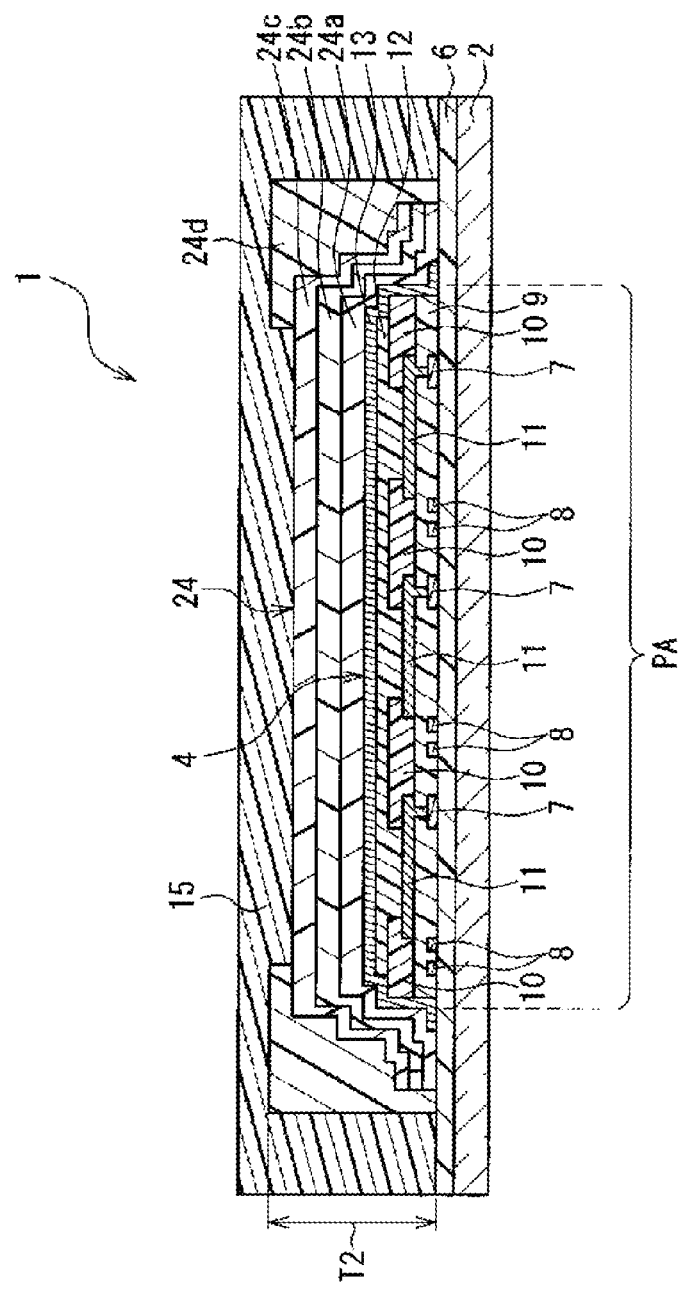
FIG. 10 is a diagram illustrating a configuration of main components of the organic EL display device according to a second embodiment of the present invention.
Figure 11:
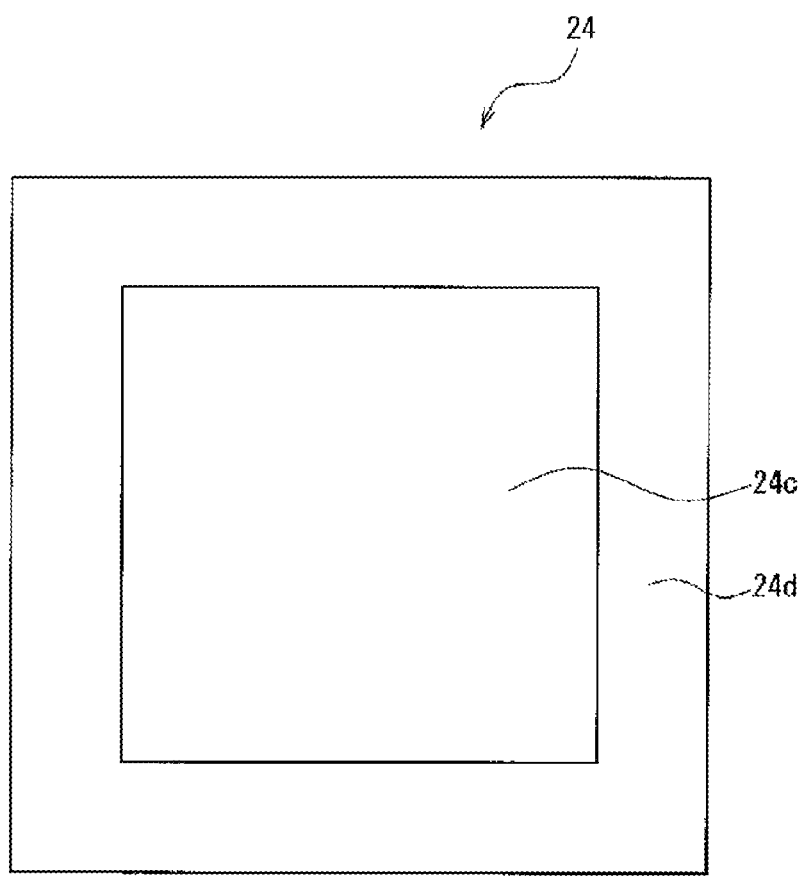
FIG. 11 is a diagram illustrating a configuration of main components of an inorganic film included in a sealing film illustrated in FIG. 10.

FIG. 10 is a diagram illustrating a configuration of main components of the organic EL display device according to a second embodiment of the present invention. FIG. 11 is a diagram illustrating a configuration of main components of an inorganic film included in a sealing film illustrated in FIG. 10.

In the drawings, main points of difference between the present embodiment and the first embodiment described above are that, in a sealing film, an inorganic film is used that is provided in a position furthest from the organic EL element as the at least one layer of inorganic film and configured in a frame shape. Note that elements that are the same as those of the first embodiment described above are denoted by the same reference signs, and a duplicated description thereof is omitted.

Specifically, as illustrated in FIG. 10, in the organic EL display device 1 of the present embodiment, an inorganic film 24a, an organic film 24b, and an inorganic film 24c are included in a sealing film 24 that seals the organic EL element 4. Further, an inorganic film 24d, which is provided in the position furthest from the organic EL element 4, is included in the sealing film 24.

The inorganic film 24d configures the at least one layer of inorganic film, and the thickness of a peripheral portion thereof is made thick. Specifically, as illustrated in FIG. 11, the inorganic film 24d is configured in a frame shape, namely is configured by the peripheral portion only and the central portion thereof is not formed. Further, the thickness (indicated by "T2" in FIG. 10) of the inorganic film 24d is set to 50 nm or greater, for example.

With the above configuration, in the present embodiment, the same operations and effects can be obtained as those of the first embodiment. Further, in the present embodiment, in the sealing film 24, as the at least one layer of inorganic film, the inorganic film 24d is used that is provided in the position furthest from the organic EL element 4, and is also configured in the frame shape. In this way, the at least one layer of inorganic film described above can be easily formed, and the organic EL display device 1 offering excellent reliability can be easily configured.

Third Embodiment

Figure 12:
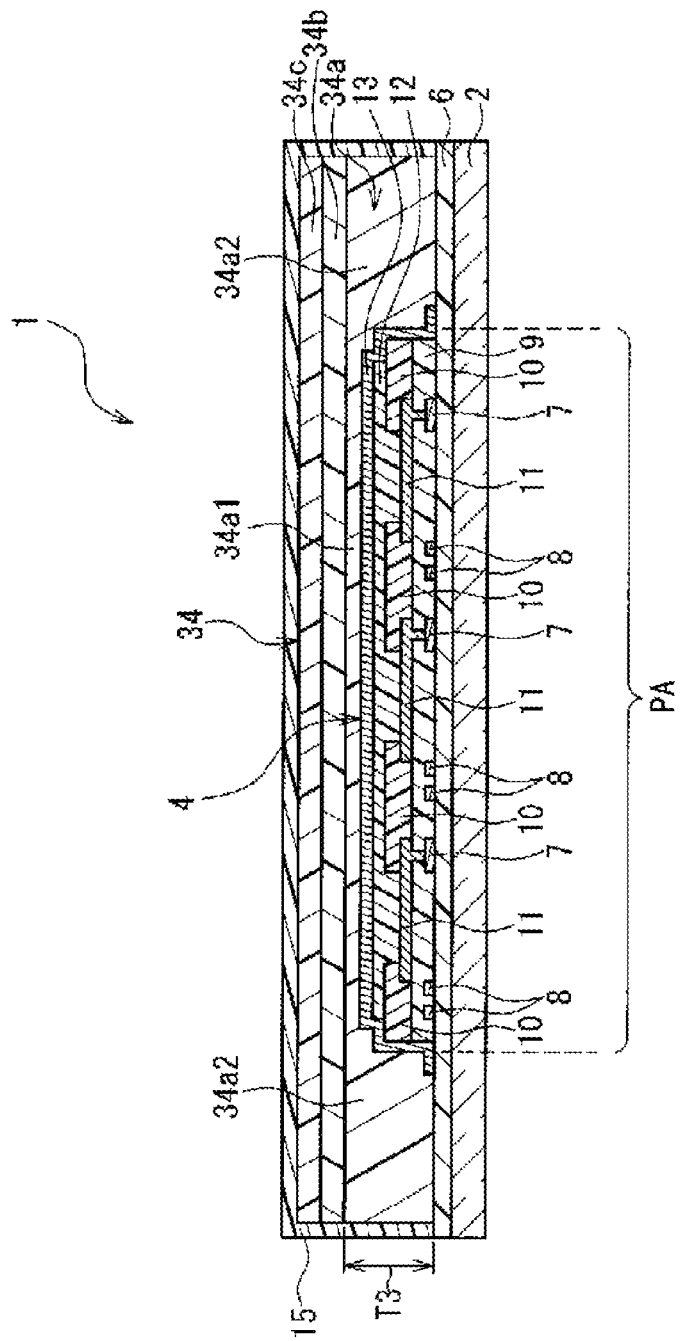
FIG. 12 is a cross-sectional view illustrating a cross section of the organic EL display device according to a third embodiment of the present invention.

FIG. 12 is a cross-sectional view illustrating a cross section of the organic EL display device according to a third embodiment of the present invention.

In the drawings, a main point of difference between the present embodiment and the first embodiment described above is that, in a sealing film, a leveled film is provided on an inorganic film (the at least one layer of inorganic film) provided in a position closest to the organic EL element. Note that elements that are the same as those of the first embodiment described above are denoted by the same reference signs, and a duplicated description thereof is omitted.

Specifically; as illustrated in FIG. 12, in the organic EL display device 1 of the present embodiment, an inorganic film 34a, a leveled film 34b, and an inorganic film 34c are included in a sealing film 34 that seals the organic EL element 4. Further, of the sealing film 34, the inorganic film 34a provided in the position closest to the organic EL element 4 configures the at least one layer of inorganic film. Specifically, in the inorganic film 34a, the thickness of a peripheral portion 34a2 is thicker than the thickness of a central portion 34a1.

More specifically, in the inorganic film 34a, the thickness of the central portion 34a1 is set to 10 nm, for example. Meanwhile, the thickness (indicated by "T3" in FIG. 12) of the peripheral portion 34a2 is set to 50 nm or greater, for example.

A synthetic resin, such as an acrylic resin or diisocyanate, is used in the leveled film 34b, for example. The leveled film 34b is provided covering the top surface of the inorganic film 34a, and is configured such that the top surface of the leveled film 34b is flat. Further, the inorganic film 34c is formed covering the top surface of the leveled film 34b.

With the above configuration, in the present embodiment, the same operations and effects can be obtained as those of the first embodiment. In addition, in the present embodiment, the leveled film 34b is provided on the inorganic film (the at least one layer of inorganic film) 34a, and thus the inorganic film 34c and the liquid repellent layer 15 that are formed on the leveled film 34b can be easily formed.

Note that all of the embodiments described above are simply examples and in no way limit the present invention. A technical range of the present invention is prescribed by the scope of the claims, and all changes that are within an equivalent range of the configurations described therein are also included in the technical range.

For example, in the above description, a case is described in which the organic EL element is used as the electroluminescent element, but the present invention is not limited to this example, and an inorganic EL element having an inorganic compound may be used, for example.

Further, in the above description, a case is described in which the sealing film is used that is formed by the layered structure of the inorganic film and the organic film (the leveled film), but the sealing film of the present invention is not limited to this example, and it is sufficient that the sealing film include one or more layers of inorganic film, and in the one or more layers of inorganic film, the peripheral portion of the at least one layer of inorganic film be made thick.

In addition, in the above description, cases are described in which the inorganic film provided in the position closest to the organic EL element (the electroluminescent element) or the inorganic film provided in the position furthest from the organic EL element is used as the at least one layer of inorganic film, but the present invention is not limited to these examples. For example, both the inorganic film provided in the position closest to the organic EL element and the inorganic film provided in the position furthest from the organic EL element may be used as the at least one layer of inorganic film, or, of three layers of the inorganic film, a center inorganic film may be used as the at least one layer of inorganic film.

Additionally, in the above description, a case is described in which the aspect of the present invention is applied to the active-matrix organic EL display device having the thin film transistor (TFT) 7, but the present invention is not limited to this example, and may be applied to a passive-matrix organic EL display device that is not provided with the thin film transistor.

Further, in the above description, a case is described in which the aspect of the present invention is applied to the organic EL display device, but the present invention is not limited to this example, and may also be applied to an illumination device, such as a backlight device, for example.

Further, in addition to the above description, each of the first to third embodiments described above may be combined as appropriate.

INDUSTRIAL APPLICABILITY

The present invention is useful for an electroluminescent device offering excellent reliability that can improve barrier properties for an electroluminescent element and can significantly suppress the occurrence of deterioration in the electroluminescent element caused by moisture, and for a production method for the electroluminescent device.

REFERENCE SIGNS LIST

1 Organic EL display device
2 TFT substrate (substrate)
4 Organic EL element (electroluminescent element)
14, 24, 34 Sealing film
14a, 14c, 24a, 24c, 24d, 34a, 34c Inorganic film
14a2, 34a2 Peripheral portion
15 Liquid repellent layer
34b Leveled film

What is claimed is:

1. An electroluminescent device comprising:
a substrate;
an electroluminescent element provided on the substrate; and
a sealing film configured to seal the electroluminescent element;
wherein the sealing film includes a first inorganic film, a second inorganic film and a leveled film, wherein the first inorganic film, the leveled film and the second inorganic film are provided in that order from the substrate,
the second inorganic film covers a surface and an edge of the leveled film,
a peripheral portion of the first inorganic film is thick,
a liquid repellent layer is provided covering the sealing film,
the liquid repellent layer is provided covering an edge of the first inorganic film, a peripheral surface of the first inorganic film, an edge of the second inorganic film, and a surface of the second inorganic film,
the peripheral surface of the first inorganic film being uncovered by the second inorganic film, and
the peripheral portion of the first inorganic film overlaps the edge of the leveled film and the edge of the second inorganic film.

2. The electroluminescent device according to claim 1, wherein a thickness of a peripheral portion of the first inorganic film is not less than 50 nm.

3. The electroluminescent device according to claim 1, wherein fluorine is used in the liquid repellent layer.

4. An electroluminescent device comprising:
a substrate;
an electroluminescent element provided on the substrate; and
a sealing film including a third inorganic film and configured to seal the electroluminescent element;
wherein the sealing film includes a first inorganic film, a second inorganic film and a leveled film, the third inorganic film, the leveled film, the second inorganic film and the first inorganic film are provided in that order from the substrate,
the first inorganic film covers an edge of the third inorganic film, an edge of the leveled film and an edge of the second inorganic film,
the first inorganic film is configured in a frame shape and has an opening which overlaps a pixel area,
a peripheral portion of the first inorganic film is thick,
a liquid repellent layer is provided covering the sealing film, and
the liquid repellent layer is provided covering an edge of the first inorganic film and a surface of the second inorganic film.

5. The electroluminescent device according to claim 4, wherein a thickness of a peripheral portion of the first inorganic film is not less than 50 nm.

6. The electroluminescent device according to claim 4, wherein fluorine is used in the liquid repellent layer.

7. The electroluminescent device according to claim 4, wherein the liquid repellent layer covers the edge of the first inorganic film, a surface of the first inorganic film and the surface of the second inorganic film, the surface of the second inorganic film being exposed from the opening.

* * * * *